United States Patent [19]

Furuhashi

[11] 3,739,292

[45] June 12, 1973

[54] AMPLIFIER CIRCUIT USING COMPLEMENTARY SYMMETRY TRANSISTORS

[75] Inventor: Tokio Furuhashi, Tokyo, Japan

[73] Assignee: Nippon Electric Company Limited, Tokyo, Japan

[22] Filed: June 29, 1972

[21] Appl. No.: 267,697

[52] U.S. Cl. .................... 330/17, 330/13, 330/15, 330/18, 330/19

[51] Int. Cl. .................... H03f

[58] Field of Search .................... 330/13, 15, 17, 18, 330/19

[56] References Cited

UNITED STATES PATENTS 3,154,639 10/1964 Rakha et al. .................... 330/17 X 3,437,946 4/1969 Someda .................... 330/18 X

*Primary Examiner*—Roy Lake

*Assistant Examiner*—Lawrence J. Dahl

*Attorney*—Nichol M. Sandoe, Roy C. Hopgood, John M. Calimafde et al.

[57] ABSTRACT

An amplifier circuit includes two sets of complementary-symmetry transistors. The base of the PNP transistor of the second complementary symmetry stage is connected to a junction between the emitters of the NPN and PNP transistors of the first stage. The base of the NPN transistor of the second stage is connected to an impedance element and to the load. The impedance element is connected in series with the collector of a transistor in a driver circuit.

3 Claims, 3 Drawing Figures

AMPLIFIER CIRCUIT USING COMPLEMENTARY SYMMETRY TRANSISTORS

BACKGROUND OF THE INVENTION

The present invention relates to an amplifier circuit using complementary-symmetry transistors. More particularly the circuit comprises an NPN transistor and a PNP transistor, wherein an output load is connected to a junction between the emitters of the two transistors, and wherein the two transistors are driven alternately by each half-wave of the input signal, thereby producing a push-pull output across the output load.

A conventional amplifier circuit using complementary-symmetry transistors comprises a driver stage having a load and two diodes, and a complementary-symmetry transistor amplifier stage having an NPN transistor and a PNP transistor. The driver stage comprises an emitter-grounded transistor, with the collector of the transistor, two diodes and the load connected in series in this order. The bases of the NPN and PNP transistors are connected to the two diodes, respectively. This amplifier circuit provides an output across the load connected to a connection junction between the two emitters, This type of a complementary-symmetry transistor amplifier circuit has been widely used because of its comparatively high operating efficiency. However, it possesses some significant shortcomings. Specifically, if the impedance of the load of the driver stage is increased to obtain a high gain, the driving current supplied to the complementary-symmetry transistor circuit decreases. Therefore, a large output can not be obtained across the output load. On the other hand, the input impedance of the complementary-symmetry amplifier stage has a greater influence on the driver stage than the load at the driver stage. This causes distortion in the output when the characteristic matching between the PNP and NPN transistors is incomplete. When the complementary-symmetry transistors are not of uniform characteristic, as is often the case in semiconductor integrated circuits, this problem is particularly troublesome.

It is therefore an object of the present invention to provide an amplifier circuit using complementary-symmetry amplifier transistors which permit the load impedance to take a sufficiently higher value for the purpose of minimizing the power consumed by the amplifier circuits, yet capable of producing a large distortion-free output.

SUMMARY OF THE INVENTION

According to one aspect of the present invention, the amplifier circuit comprises a driver stage having first and second impedance elements and a load connected in series; a first complementary-symmetry amplifier stage having a first NPN transistor and a first PNP transistor, the bases of the first NPN and PNP transistors being connected to the ends of the first impedance element; a second complementary-symmetry amplifier stage having a second NPN transistor and a second PNP transistor, the base of the second PNP transistor being connected to a junction between the emitters of the first complementary-symmetry amplifier stage, the base of the second NPN transistor being connected to a junction between the second impedance element and said load; first and second power sources, the positive electrode of the first power source being connected to said load and the collectors of the first and second NPN transistors, the negavite electrode of the second power source being connected to a ground potential point of the driver stage and the collectors of the first and second PNP transistors, the negative electrode of the first power source and the positive electrode of the second power source being connected to each other; and an output load connected between the junction of the emitters of the second complementary-symmetry circuit at one side and the junction of the first and second power sources at the other side. Diodes are preferred as the first and second impedance elements.

In operation a half-wave of the input signal is supplied through the base of the first PNP transistor of the first complementary-symmetry stage to the base of the second PNP transistor of the second complementary-symmetry stage, thereby effecting current supply to the output load, while the other half-wave of the input signal is supplied to the base of the second NPN transistor of the second complementary-symmetry stage, thereby effecting current supply to the output load.

According to the present invention, the load impedance of the driver stage can be increased without being affected by the input impedance of the following amplifier stage, because the input impedance of the amplifier circuit having two complementary-symmetry stages is sufficiently high, even if low impedance elements are used as the output load. This makes it possible to obtain high gain and low power consumption in the driver stage. Furthermore, one-half of the input signal wave is amplified by one transistor, while the other half is amplified by two transistors. This permits the use of low gain transistors for amplifying the second half of the input signal. This is a favorable circuit configuration for semiconductor integrated circuits, where it is very difficult to achieve equal gain in PNP and NPN transistors amplifier stages. Moreover, in semiconductor integrated circuits particularly, the output distortion is effectively eliminated, because the gain of the amplification of the two halves of the input signal are nearly equal. Together with the high input impedance of the complementary-symmetry stage, the output distortion is more effectively diminished. Moreover, since a suitable impedance element, such as a diode and diode-connected transistor, is inserted between the bases of the NPN and PNP transistors of each complementary-symmetry stage, the base-bias current is stably supplied to each transistor. This is also favorable for semiconductor integrated circuit, the base-bias of which is difficult to control externally.

BRIEF DESCRIPTION OF THE DRAWINGS

The objects, features and advantages of the present invention will be better understood from the following detailed description taken in conjunction with the accompanying drawings wherein.

DESCRIPTION OF THE PREFERRED EMBODIMENTS

Figures 1, 2:
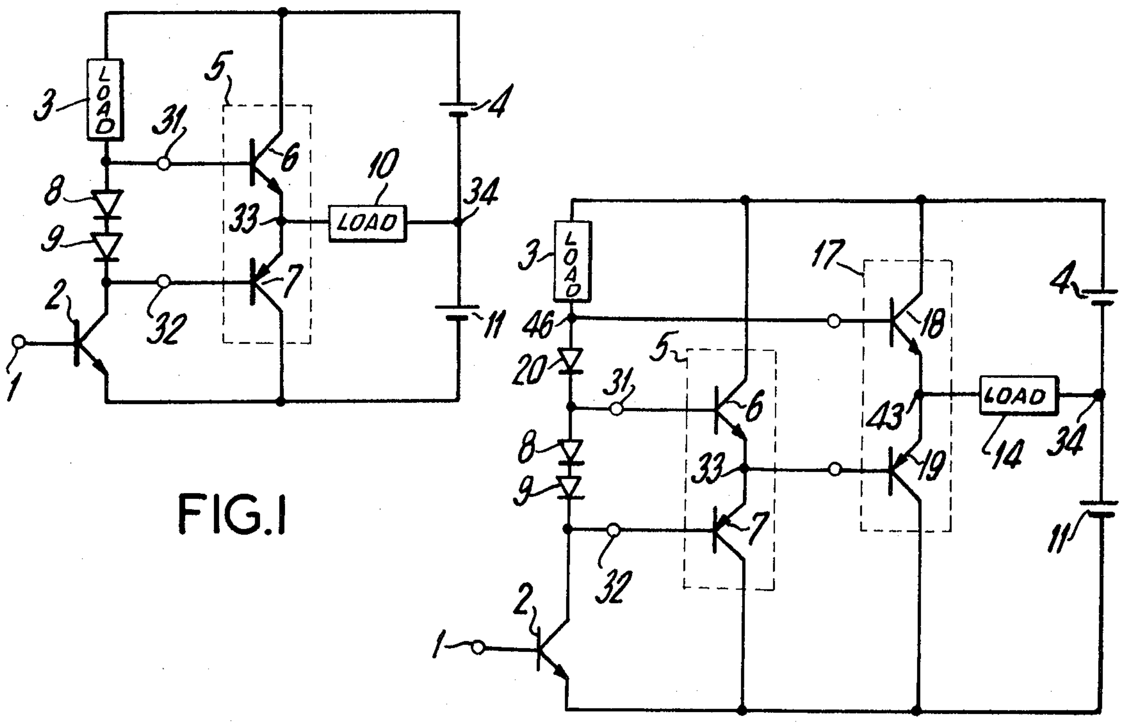
FIG. 1 is a circuit diagram showing a conventional amplifier circuit using complementary-symmetry transistors.
FIG. 2 is a circuit diagram showing a first embodiment of the present invention.

Referring now to FIG. 1, which illustrates a conventional complementary-symmetry transistor amplifier stage. An input signal from an input terminal 1 is supplied to the base of a grounded-emitter NPN drive transistor 2. The collector of this transistor is connected through diodes 8 and 9 and a load 3 to a power source 4. The base of an NPN transistor 6 is connected to a terminal 31, while the base of a PNP transistor 7 is connected to a terminal 32, and the emitters of the transistors 6 and 7 are connected to each other at a junction 33, whereby a complementary-symmetry amplifier stage 5 is formed. The polarity of the diodes 8 and 9 is the same as that of the base-emitter junctions of the transistors 6 and 7, whereby the complementary-symmetry stage 5 can be driven without causing cross-over distortion. The diodes 8 and 9 have the function of compensating for the thermal drift of the base-biassing current. These diodes 8 and 9 may be replaced by other circuit elements such as transistors each having at least one PN junction. The signals appearing at the terminals 31 and 32 are supplied to the bases of the transistors 6 and 7, respectively. The emitter of the drive transistor 2 and the collector of PNP transistor 7 are connected to the negative electrode of the power source 11. The load 3 and the collector of the NPN transistor 6 are connected to the positive electrode of the power source 4. The positive electrode of the power source 11 and the negative electrode of the power source 4 are connected to each other at a junction 34. An output load 10 is connected between the junctions 33 and 34.

In operation, a half-wave of the input signal supplied to the input terminal 1 places one of the transistors 6 and 7 in the operative state, supplying current to the output load 10, while the other half-wave similarly turns on the other transistors 6 and 7 thereby supplying current to the output load 10. Thus, the transistors 6 and 7 function as a class-B amplifier, permitting the output current to flow through the output load 10 in a push-pull manner. The serial diodes 8 and 9 connected between the bases of the transistors 6 and 7 make it possible to supply a stable bias current to the transistors 6 and 7.

In this conventional amplifier circuit, an increase in the impedance at the load 3 to obtain a high gain at the driver stage inevitably results in a decrease in the current flowing through the load 3, with the result that the base current flowing in the transistors 6 and 7 of the complementary-symmetry stage 5 is lowered to a level which is insufficient to drive these transistors 6 and 7. Consequently, a large output cannot be obtained across the output load 10. Furthermore, the effective load impedance of the transistor 2 depends heavily upon the input impedance of the complementary-symmetry stage 5, because of the low impedance of that stage when compared to the load 3. This is unfavorable, particularly when the output load 10 is of low impedance, because the input impedance of the complementary-symmetry stage 5 is directly proportional to the impedance of the output load 10. Moreover, the input impedance of the amplifier stage 5 differs for one half-wave of the input signal as compared to the other half-wave. This is due to the unequal current gain at the transistors 6 and 7. Therefore, an increase in impedance of the drive load 3 results in an increased difference in the effective load impedance of the transistor 2 for one half-wave of the input signal as compared to the other half-wave. Thus, distortion in the output is not avoidable. When the amplifier as a whole is made in the form of a semiconductor integrated circuit, the above-outlined problem is particularly serious because it is very difficult to provide separate NPN and PNP transistors of identical characteristics in this form.

One approach to this problem is to employ a Darlington circuit comprising an NPN transistor and a PNP transistor in place of the PNP transistor 7 of the complementary-symmetry stage 5. In a semiconductor integrated circuit, the bias current is not controlable externally. This means that undesirable bias current flowing in the transistors of the complementary-symmetry stage cannot be adjusted once the semiconductor integrated circuit is manufactured. Another proposal is to use a constant current regulator for the load 3 and to increase the effective load impedance attributable to the collector output impedance of the constant current regulator, thereby increasing the gain of the driver stage. In this circuit, the bias current of the transistor 2 is determined by the current flowing through the constant current regulator. However, if the current flowing through the constant current regulator is decreased to minimize the power consumed by the amplifier circuit as a whole, the effective impedance of the drive load 3 increases in inverse proportion to the constant current value. As a result, this circuit also gives rise to output distortion as in the circuit shown in FIG. 1. Furthermore, it is extremely difficult to supply a constant bias current to the complementary-symmetry stage 5 without sacrificing other necessary operating conditions.

Referring now to FIG. 2, in which like numerals denote components similar to those shown in FIG. 1, an embodiment of this invention includes a second complementary-symmetry amplifier stage comprising an NPN transistor 18 and a PNP transistor 19 having their emitters connected to each other at a point 43. The collectors of these transistors are connected to the positive electrode of a power source 4 and to the negative electrode of another power source 11, respectively. The output load 14 is connected at one side to a point 43 and at the other side to a point 34 between the power sources 4 and 11. The base of the PNP transistor 19 is connected to the point 33 of the first complementary-symmetry amplifier circuit 5. Hence the transistor 19 is driven by the output of the first complementary-symmetry stage 5. A diode 20 is connected between the drive load 3 and the diode 8 in the same direction as the diode 8. The junction 46 between the diode 20 and the load 3 is connected to the base of the transistor 18. In other words, the diode 20 is inserted between the base of the NPN transistor 6 of the first complementary-symmetry stage 5 and the base of the NPN transistor 18 of the second complementary-symmetry stage 17.

In this circuit configuration, a rise in the potential at the drive terminal 46 brings the transistor 18 into an operating state, causing the driving current to flow into the output load 14. On the other hand, a lowering of the potential at the terminal 32 brings the transistors 7 and 19 into an operating state, causing a sink current to flow into the transistor 19 via the output load 14. Thus this circuit operates as a push-pull amplifier. As illustrated, the diode 20 and the PN junction of the transistor 6 are inserted between the bases of the two transistors 18 and 19 of the second complementary-symmetry stage 17. This circuit configuration is exactly the same as the first complementary-symmetry stage 5 comprising diodes 8 and 9 which are connected between the bases of the transistors 6 and 7. In other words, a base-bias current is stably supplied to the transistors 18 and 19 of the second complementary-symmetry stage 17.

A semiconductor integrated circuit is usually formed in a p-type silicon substrate wherein an NPN transistor with a large current gain can easily be formed, but an PNP transistor with a large current gain cannot be formed without substantial difficulty. In FIG. 2, the current gain $h_{FE}$ can be sufficiently increased in the transistor 18 as long as this transistor is of NPN type. In the transistor 19 which is usually of PNP type, it is impossible to obtain a current gain $h_{FE}$ high enough to be comparable to that of the NPN transistor 18. Whereas, according to the present invention, one-half of the input signal is amplified by a factor of two by a pair of PNP transistors 7 and 19, and thus can be amplified with almost the same current gain as that of one NPN transistor. This makes available a greater output at the output load 14. At the same time, the input impedance of the complementary-symmetry amplifier stage composed of the complementary-symmetry transistors 6 and 7 is increased. Therefore, the effective load impedance of the driver transistor 2 depends not upon the input impedance of the complementary-symmetry stage but upon the load 3. Consequently, if there is a small mismatch in characteristics between the PNP and NPN transistors, this mismatching does not appreciably affect the amplifier operation nor does it result in substantial output distortion. This effect is particularly evident when low impedance elements are used as the load 14.

Because the emitter-bases of the PNP transistors 7 and 19 of the complementary-symmetry stages 5 and 17 are series in the forward direction, the emitter current of the transistor 7 is $i_B+h_{FE1}\cdot i_B$ (where $h_{FE1}$ is the current gain of transistor 7) with respect to the base current $i_B$ of the transistor 7. Also, the emitter current of the transistor 19 is $i_B+h_{FE1}\cdot i_B+(i_B+h_{FE1}\cdot i_B)h_{FE2}$ (where $h_{FE2}$ is the current gain of transistor 19). Hence the sink current flowing into the transistor 19 from the output load 14 is markedly increased.

In this embodiment, the diodes 8, 9 and 20 may be replaced by other components which have at least one PN junction or other suitable impedance elements. When a resistance element is employed, one suitable element is sufficient to replace the diode 8 and 9.

To increase the above-mentioned sink current, the active circuit 25 such as an amplifier circuit may be driven by the collector output of the PNP transistor 7, with the output of this active circuit 25 supplied to the point 43, permitting the sink current to flow into the active circuit 25 from the load 14 and another sink current to flow into the transistor 19.

Figure 3:
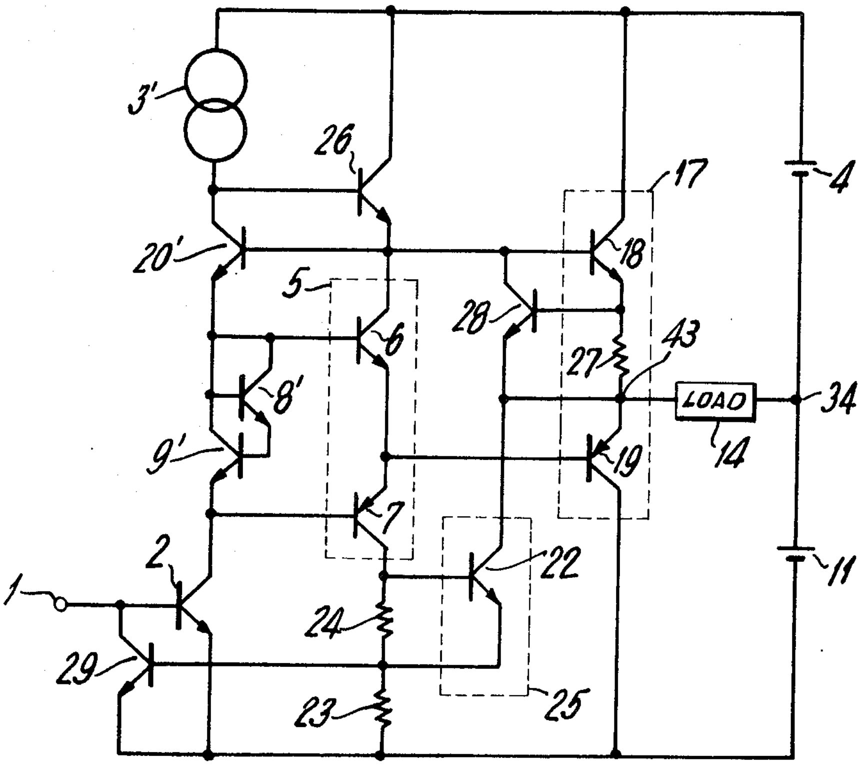
FIG. 3 is a circuit diagram showing a second embodiment of the present invention.

An exemplary embodiment of this invention is shown in FIG. 3, in which like elements are denoted by like reference numerals. In FIG. 3, the base of an NPN transistor 22 is connected to the collector of a PNP transistor 7 of a first complementary-symmetry stage 5, the emitter of the NPN transistor 22 is connected to the negative pole of the power source 11 through a resistor 23, and the collector of the NPN transistor 22 is connected to the output load 14 and to the emitter of the transistor 19. If necessary, a resistor 24 can be connected between the base and emitter of the NPN transistor 22. In this circuit, the collector output of the transistor 7 is amplified by an active circuit 25 comprising the transistor 22, and the amplified current flows as the sink current through the output load 14. In addition, the sink current due to the emitter current of the transistors 7 and 19 is caused to flow therethrough. This results in a large total sink current. The active circuit 25 operates only when the transistor 7 is in the conductive state. Therefore, the active circuit 25 does not have any undesirable effect upon the amplifier circuit. In other words, the current dependent on the collector current of the transistor 7 can be supplied to the output load 14 almost without regard for the value of the impedance of the output load 14. Thus the current supplied to the output load is stable.

As described above, the marked increase in the sink current flowing through output load 14 tends to reduce the drive current flowing through the output load 14. To compensate for this effect, a transistor 20' may be used in place of the diode 20, with the emitter of the transistor connected to the base of the NPN transistor 6, the collector connected to a constant current regulator 3' used as the load, at the driver circuit, and the base connected to the base of the NPN transistor 18. In this arrangement, the PN junction between the base and the emitter of the transistor 20' and the PN junction between the base and the emitter of the transistor 6 are inserted between the bases of the transistors 18 and 19. The junction of the collector of the transistor 20' and the constant current regulator 3' is connected to the base of the NPN transistor 26, while the collector of the transistor 26 is connected to the positive electrode of the power source 4, and the emitter of the transistor 26 is connected to the bases of the transistors 18 and 20'. In this example, transistors 8' and 9' are used in place of the diodes 8 and 9 employed in the embodiment of FIG. 2.

When the drive transistor 2 is turned on, a current is caused to flow from the constant current regulator 3' (i.e., load 3) to the transistors 8' and 9' of the diode connection by way of the base-emitter of the transistor 26 and also the base-emitter of the transistor 20'. As a result, the collector current is caused to flow through the transistor 20', and the base current of the transistor 26 decreases by the amount of the collector current of the transistor 20'. The small base current is amplified by the transistor 26 and then supplied to the base of the transistor 18, thereby causing a large emitter current to flow in the transistor 18. Thus, the output of the transistor 2 is amplified by the NPN transistors 26 and 18, to generate a large output across the output load 14.

The circuit shown in FIG. 3 permits the detection of an unduly large current flowing through the output load 14 due to, for example, a short-circuit. For this purpose, a resistor 27 is connected between the emitter of the transistor 18 and the point 34. The excessive drive current flowing through the load 14 causes a large voltage drop to develop across the resistor 27, bringing the transistor 28 into the conductive state. The base of the transistor 18 is connected to the point 43 via the collector-emitter of the transistor 28 to block the transistor 18 from its amplifying function. On the other hand, an excessive sink current flowing through the load 14 causes the current gain of the transistor 19 to decrease with the result that a great portion of the current is directed to the transistor 22, the resistor 23 produces a large voltage drop due to the emitter current of the transistor 22, the voltage drop brings the transistor 29 into a conductive state to form a short-circuit between the base and emitter of the drive transistor 2, and the transistor 2 ceases its operation.

This amplifier circuit has a loop (the emitter of transistor 19 — the base of transistor 19 — the emitter of transistor 7 — the collector of transistor 7 — the base of transistor 22 — the collector of transistor 22 — the emitter of transistor 19). The gain of this loop is decreased by the transistors 7 and 19, and part of the signal is bypassed from the emitter of the transistor 7 by way of the transistor 6. Hence, there is no possibility of the loop starting an oscillation due to positive feedback, even if the sink current is increased by a transistor having a large current gain. The active circuit 25 may be arranged not only for amplification but also for wave shaping. As a modification of this circuit, one or two suitable impedance elements may be used in place of the diodes 8 and 9.

While the concept of the invention has been described above in connection with the specific embodiments of FIGS. 2 and 3 and particular modifications thereof, it should be understood that this description is made only by way of example and is not a limitation to the scope of the invention. Moreover, numerous additional variations falling within the scope of the invention will occur to those skilled in the art.

I claim:

1. An amplifier circuit including complementary-symmetry transistors, comprising;

a driver circuit including a transistor, first and second impedance elements connected in series with the collector of said transistor, and a load connected to said second impedance element;

a first complementary-symmetry amplifier stage having a first NPN transistor and a first PNP transistor, the emitters of said first NPN and PNP transistors being connected to each other, and the bases of said first NPN and PNP transistors being connected to the two ends of said first impedance element, respectively;

a second complementary-symmetry amplifier stage having a second NPN transistor and a second PNP transistor, the emitters of said second NPN and PNP transistors being connected with each other, the base of said second PNP transistor being connected to the junction of the emitters of said first NPN and PNP transistors, and the base of said second NPN transistor being connected to a junction of said second impedance element and said load;

a first power source for supplying a positive voltage to said load and to the collectors of said first and second NPN transistors;

a second power source for supplying a negative voltage to the ground potential point of said driver circuit and the collectors of said first and second PNP transistors, the positive electrode of said second power source being connected to the negative electrode of said first power source; and an output load connected at one side to a junction between the emitters of said second PNP and NPN transistors and at the other side to a junction between the first and second power sources.

2. An amplifier circuit as set forth in claim 1, wherein said first and second impedance elements each include at least one PN junction.

3. An amplifier circuit as set forth in claim 1, further comprising an active circuit, the input terminal of said active circuit being connected to the collector of said first PNP transistor and the output terminal of said active circuit being connected to the emitters of said second NPN and PNP transistors.

* * * * *